(12) United States Patent
Chakravarty (10) Patent No.: US 8,473,792 B2
(45) Date of Patent: Jun. 25, 2013

(54) LOGIC BIST FOR SYSTEM TESTING USING STORED PATTERNS

(75) Inventor: Sreejit Chakravarty, Mountain View, CA (US)

(73) Assignee: LSI Corporation, Milpitas, CA (US)

( * ) Notice: Subject to any disclaimer, the term of this patent is extended or adjusted under 35 U.S.C. 154(b) by 276 days.

(21) Appl. No.: 12/985,604

(22) Filed: Jan. 6, 2011

(65) Prior Publication Data

US 2012/0179946 A1 Jul. 12, 2012

(51) Int. Cl.
*G01R 31/28* (2006.01)

(52) U.S. Cl.
USPC .......................................................... 714/726

(58) Field of Classification Search
None
See application file for complete search history.

(56) References Cited

U.S. PATENT DOCUMENTS

| | | | | |
|---|---|---|---|---|
| 5,329,533 A * | 7/1994 | Lin | ............................... | 714/727 |
| 6,189,115 B1 * | 2/2001 | Whetsel | ........................... | 714/28 |
| 6,327,687 B1 * | 12/2001 | Rajski et al. | .................. | 714/738 |
| 6,574,762 B1 * | 6/2003 | Karimi et al. | ................. | 714/727 |
| 6,715,105 B1 * | 3/2004 | Rearick | ........................... | 714/30 |
| 6,744,274 B1 * | 6/2004 | Arnold et al. | .................... | 326/16 |
| 6,948,096 B2 | 9/2005 | Parvathala et al. | | |
| 7,231,563 B2 * | 6/2007 | Vinke et al. | .......................... | 714/718 |
| 7,353,440 B2 * | 4/2008 | Ohwada et al. | ............... | 714/726 |
| 7,392,413 B2 * | 6/2008 | Shikata | ........................ | 713/321 |
| 7,404,126 B2 * | 7/2008 | Jain et al. | ...................... | 714/726 |
| 7,490,279 B1 * | 2/2009 | Kumar et al. | ................... | 714/733 |
| 7,760,796 B2 * | 7/2010 | Iadanza | ........................ | 375/226 |
| 2003/0009715 A1 * | 1/2003 | Ricchetti et al. | ............... | 714/727 |
| 2003/0193996 A1 * | 10/2003 | Iadanza | ........................ | 375/219 |
| 2004/0003329 A1 * | 1/2004 | Cote et al. | ...................... | 714/726 |
| 2005/0268194 A1 * | 12/2005 | Wang et al. | ...................... | 714/733 |
| 2005/0289419 A1 * | 12/2005 | Okano et al. | ................... | 714/726 |
| 2006/0107160 A1 * | 5/2006 | Ricchetti et al. | ............... | 714/742 |
| 2007/0033471 A1 * | 2/2007 | Damodaran et al. | .......... | 714/733 |
| 2007/0220383 A1 * | 9/2007 | Kiryu | ............................... | 714/726 |
| 2008/0016421 A1 * | 1/2008 | McDevitt | ....................... | 714/733 |
| 2008/0104466 A1 * | 5/2008 | Menon et al. | .................. | 714/727 |
| 2011/0231722 A1 * | 9/2011 | Mukherjee et al. | ........... | 714/729 |

* cited by examiner

*Primary Examiner* — Guerrier Merant (57) ABSTRACT

A stored-pattern logic self-test system includes a memory, a device under test and a test controller. The memory stores test pattern data including test stimuli. The device under test includes a scan chain and a test access port configurable to control operation of the scan chain. The test controller is configured to test the device under test by controlling the memory to output the test stimuli to the device under test. The test controller controls the test access port to load the test stimuli into the scan chain, and receives and evaluates response data from the device under test.

19 Claims, 11 Drawing Sheets

FIG. 11

LOGIC BIST FOR SYSTEM TESTING USING STORED PATTERNS

TECHNICAL FIELD

This application is directed, in general, to an electronic device, and, more specifically, to self-testing thereof.

BACKGROUND

An electronic device such as an integrated circuit (IC) sometimes includes self-test circuitry that may be used to determine device functionality of the IC before or after deployment of the device in a product. The self-test circuitry may include scan chains typically used to test combinatorial logic on the IC. The scan chains are typically configured with a series of test patterns to test functionality of the IC at the end of the manufacturing line before the IC is shipped to a customer.

SUMMARY

One embodiment provides a stored-pattern logic built-in self-test (SP-LBIST) system. The system includes a memory, a device under test (DUT) and a test controller. The memory stores test pattern data including test stimuli. The DUT includes a scan chain and a test access port configurable to control operation of the scan chain. The test controller is configured to test the DUT by controlling the memory to output the test stimuli to the DUT. The test controller controls the test access port to load the test stimuli into the scan chain, and receives and evaluates response data from the DUT.

Another embodiment provides a method of manufacturing an SP-LBIST system. The method includes configuring a memory to store test pattern data that includes test stimuli. A DUT includes a scan chain and a test access port (TAP) configurable to control operation of the scan chain. The DUT is configured to receive the test stimuli. A test controller is configured to test the DUT by controlling the memory to output the test stimuli to the DUT and to control the TAP to load the test stimuli into the scan chain. The test controller is further configured to receive and evaluate response data from the DUT.

Another embodiment provides an integrated circuit (IC). The IC includes scan chains and a TAP. The scan chains are configured to receive test stimuli and to apply the test stimuli to combinatorial logic. The TAP is configured to control operation of the scan chains. A test controller is configured to test the combinatorial logic by receiving TAP instructions from a memory and to control operation of the test access port in accordance with the TAP instructions. The test controller is further configured to receive and evaluate response data from the scan chains.

Another embodiment provides a SP-LBIST system for testing a DUT, the DUT including a scan chain and a TAP configurable to control operation of the scan chain. The system includes a memory and a test controller. The memory is configured to store test pattern data that include test stimuli. The test controller is configured to test the DUT by 1) controlling the memory to output the test stimuli to the device under test; 2) controlling the test access port to load the test stimuli into the scan chain; and 3) receiving and evaluating response data from the device under test.

BRIEF DESCRIPTION

Reference is now made to the following descriptions taken in conjunction with the accompanying drawings, in which.

DETAILED DESCRIPTION

Many complex IC devices include a scan chain used to functionally test the IC. The scan chain is typically used to test combinatorial logic during an end-of-line test. A tester system typically provides test patterns to the scan chains, and reads test results from the scan chain. Such testing is useful for detecting and sequestering ICs that include fatal manufacturing defects and ICs that may suffer from early failure after a short period of operation. In many cases after the IC leaves the manufacturing facility the scan chain is thereafter unused.

This disclosure benefits from the recognition by the inventor that the scan chain infrastructure on the IC may be advantageously used after the IC leaves the manufacturing environment. Test patterns may be stored in a nonvolatile memory associated with the IC. On device startup, or periodically, a controller associated with the IC may initiate and manage a test of the DUT using the test patterns. The results of the test may be used to modify operation of the IC, such as reporting the test error or disabling further operation of the IC to prevent generation of spurious results in the system employing the IC.

Figure 1:
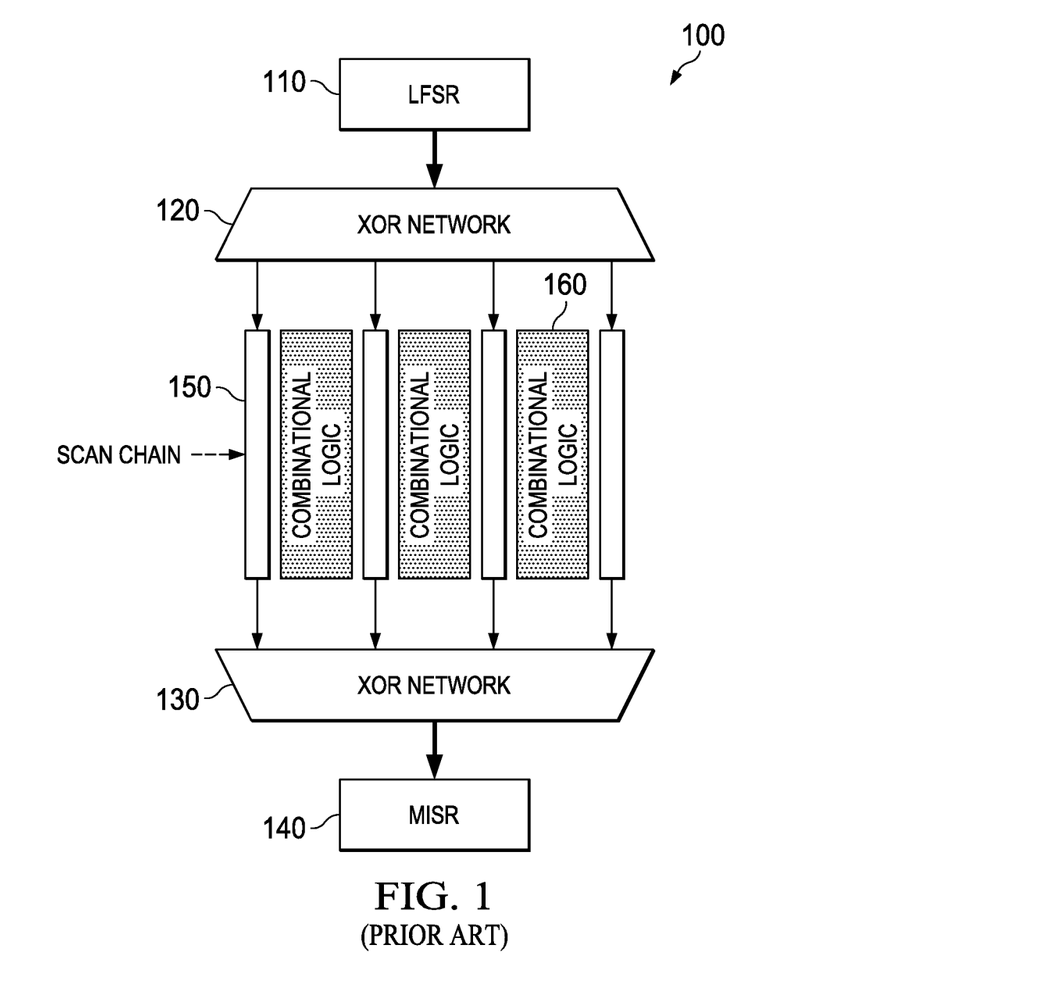
FIG. 1 illustrates a prior art logic built-in self-test (LBIST) architecture.

FIG. 1 illustrates a prior art LBIST architecture 100, or simply LBIST 100. Included are a linear-feedback shift register (LFSR) 110, an input XOR network 120, and output XOR network 130 and a multiple-input signature-register (MISR) 140. Between the XOR networks 120, 130 are scan chains 150 and combinatorial logic 160 of a device under test (DUT). Typically the LFSR 110 is seeded with an initial digital pattern, from which it generates pseudo-random bit patterns as it is clocked. The bit patterns are loaded into the scan chains 150, and then applied to the logic 160. The scan chains 150 capture the response of the logic 160 to the input bit patterns, and scan the captured output patterns to the XOR network 130. The MISR 140 accumulates each output bit pattern as reduced by the XOR network 130. When the MISR 140 has accumulated all the processed output bit patterns, a test signature results. The test signature may then be compared to a "golden" signature to determine the outcome of the test.

The conventional LBIST 100 suffers from several weaknesses that limit its practicality for use in integrated circuits. First, the LBIST 100 typically requires special design rules to isolate the logic being tested. Such isolation is intended to ensure that the LBIST 100 remains in a deterministic state. Additional logic to implement the isolation is design-dependent. Second, sometimes significant changes to the DUT are required to accommodate the LBIST 100. Such changes may, among other adverse results, compromise design timing closure. Third, the set of pseudo-random numbers generated by the LFSR 110 is closed, and may not produce a particular pattern needed to test a particular logic path. Faults related to untested paths may therefore remain undetected.

Figure 2:
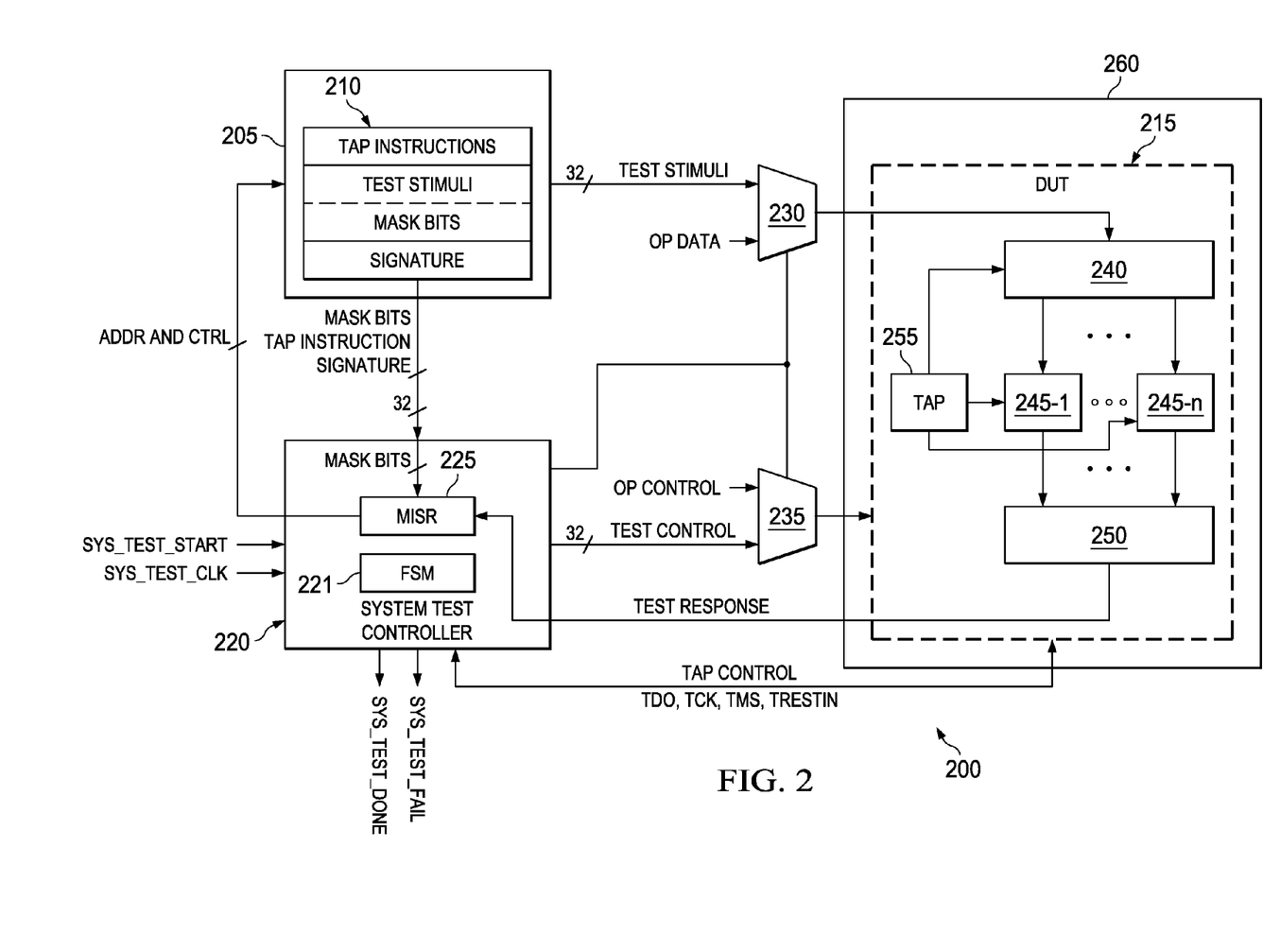
FIG. 2 illustrates a system configured to implement stored pattern LBIST (SP-LBIST), including a memory, a test controller and a device under test (DUT), the test controller having a small number of external input and external output signals.

FIG. 2 illustrates a self-contained self-test system 200 that overcomes many of the limitations of the conventional LBIST 100. The system 200 will be referred to hereinafter as the SP-LBIST (stored pattern logic built-in self test) system 200, or simply system 200. The system 200 is self-contained in that no tester system is needed or used to execute a self-test. Herein and in the claims, the term SP-LBIST refers to a self-contained system.

A memory 205 stores deterministic test patterns 210, described in detail below. In some embodiments the memory 205 is nonvolatile. The contents of the memory 205 may be stored in any desired order or configuration. In one convenient embodiment the memory 205 is 64 bits wide, e.g. eight 8-bit-wide PROMS. Those skilled in the pertinent art are familiar with the many variants of nonvolatile memory available. The test patterns 210 may be stored in the memory 205 prior to installation of the memory 205 in the system 200. For example, when the memory 205 is an EPROM, multiple instances of the memory 205 may be produced and stored, with one of the stored programmed memories being installed prior to shipment of the system 200 to an end-user. Alternatively, the memory 205 may be programmed by any well-known technique after installation.

The memory 205 communicates with a device under test (DUT) 215 and a test controller 220. The test controller 220 includes a finite state machine (FSM) 221 configured to execute control instructions. The memory 205, DUT 215 and test controller 220 may be discrete devices, or may be integrated on a single common substrate. For example, the memory 205, test controller 220 and DUT 215 may all be located on a same substrate such as a circuit board or silicon die, the memory 205 may be external to the DUT 215, or both the memory 205 and the test controller 220 may be external to the DUT 215. In the illustrated embodiment, the memory 205, DUT 215, and test controller 220 are illustrated without limitation as being discrete devices, with the DUT 215 being located on a chip 260.

The DUT 215 may include multiple domains. Each domain includes its own scan test architecture that may be used to test the particular DUT 215 using automatic test equipment (ATE) during manufacturing and at an end-of-line test prior to installing the DUT 215 into a system. The domains may each be clocked and tested separately. Such domains are referred to herein as clock domains, as discussed further below. Embodiments of the disclosure are non-intrusive in that domains may be used to test the DUT 215 after the end-of-line test without modifying the design of the domains.

The test controller 220 receives a test start signal SYS_TEST_START and a clock signal SYS_TEST_CLK. The SYS_TEST_START and SYS_TEST_CLK inputs are external input signals, meaning they are received from outside the system 200. The SYS_TEST_START and SYS_TEST_CLK signals may be provided, e.g. by a high-level controller (not shown) that places the DUT 215 into self-test mode periodically or upon demand by a user of the DUT 215. The SYS_TEST_START signal initiates the test of the DUT 215, while the SYS_TEST_CLK signal provides a test clock at a desired frequency. While not limited to any particular frequency, the SYS_TEST_CLK may be, e.g. about 40 MHz. The test controller 220 includes an MISR 225, discussed further below.

During test, the test controller 220 controls the memory 205 and a data multiplexer 230 to provide test stimuli from the memory 205 to the DUT 215. The data path from the memory 205 to the multiplexer 230 is illustrated for the purpose of discussion as being 32 bits wide. Similarly, the test controller 220 controls the memory 205 to provide, e.g. mask bits, TAP instructions and a golden signature to the test controller 220. The data path for the memory 205 and the test controller 220 is also illustrated for the purpose of discussion as being 32 bits wide. The test controller 220 also controls a multiplexer 235 to provide control signals from the test controller 220 to the DUT 215. This data path may also be 32 bits wide. Of course, it will be immediately apparent to those skilled in the art that embodiments having other data path widths, e.g. 16 or 64 bits, are within the scope of the disclosure.

Within the DUT 215 an embedded deterministic test (EDT) decompacter 240 receives the test stimuli from the multiplexer 230. The test stimuli may be highly compressed, e.g. 100× or more. The EDT decompacter 240 decompresses the test stimuli and provides the decompressed stimuli to a number of test modules 245-1 . . . 245-n, referred to collectively as test modules 245, that include scan chains. The scan chains may be of any conventional or novel design. The test modules 245 may be LBIST modules, but embodiments herein are not limited thereto. While not limiting the DUT 215 to any particular number of test modules, some designs may include 600 scan chains such as those described previously. An EDT compacter 250 receives the scan chain responses from the test modules 245, compacts the responses, and provides the compacted responses to the MISR 225 within the test controller 220.

A TAP 255 under control of the test controller 220 coordinates the operation of the EDT decompacter 240, the test modules 245 and the EDT compacter 250. Such coordination may include the operation of the other control signals generated and applied through a complex of multiplexers represented generally by the multiplexer 235. In one embodiment the test controller 220 obtains the TAP instructions from the memory 205 at the beginning of a test cycle, and issues TAP control signals to the TAP 255 to configure the DUT 215 for the test.

The MISR 225 generates a test signature associated with the test stimuli provided to the DUT 215. The memory 205 provides mask bits to the MISR 225 to mask off bits within the compacted responses that have an "unknown" or "don't care" status. Those skilled in the pertinent art appreciate that such masking may be used in conjunction with efficient implementation of compaction of the test responses.

The test controller 220 obtains the golden signature stored in the memory 205. If the test signature fails to match the golden signature, the test controller 220 asserts a test result signal SYS_TEST_FAIL to indicate the mismatch. When the test of the DUT 215 is complete, the test controller also asserts a test completion signal SYS_TEST_DONE. The SYS_TEST_FAIL and SYS_TEST_DONE signals are external output signals, meaning they are configured to convey the status of the self-test to an entity outside the system 200, such as a high-level controller.

Thus, the system 200 may operate with only four input-output (I/O) signals. In the illustrated embodiment only two external input signals, SYS_TEST_START and SYS_

TEST_CLK, are received by the test controller 220. Similarly, only two external output signals, SYS_TEST_DONE and SYS_TEST_FAIL are provided by the test controller 220.

In some embodiments the TAP 255 may initiate a system test of the DUT 215, for example after the expiration of a time period since a previous test, or on system startup. The TAP 255 may control the SYS_TEST_START signal and monitor the SYS_TEST_FAIL and the SYS_TEST_DONE signals as they are generated by the system test controller 220.

Figure 3:
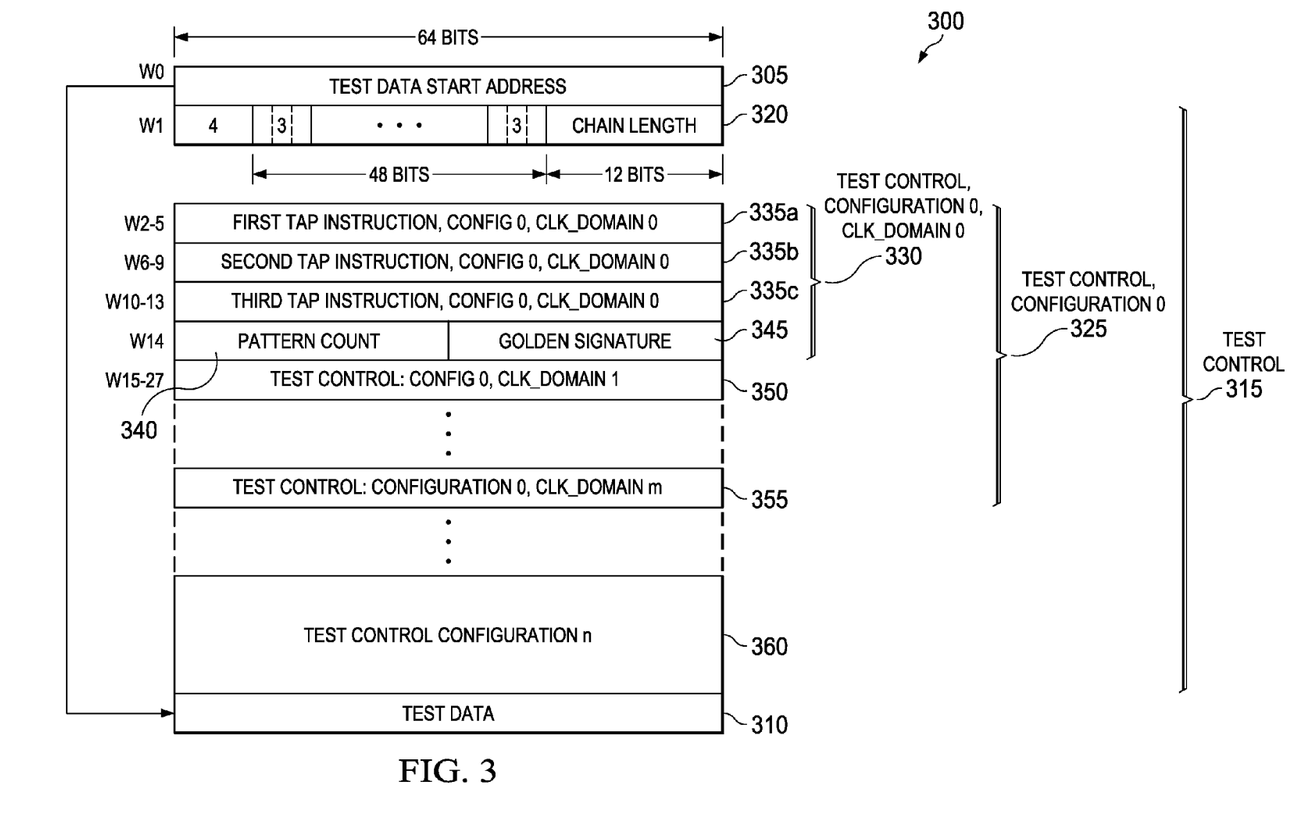
FIGS. 3 and 4 illustrate an embodiment of a memory image stored by the memory of FIGS. 2, 9 and 10.

FIG. 3 illustrates one embodiment of a memory test image, generally designated 300. The test image 300 illustrates various data fields that the test data stored by the memory 205 may include. The test image 300 is presented without limitation to a particular storage format. Furthermore, while the test image 300 is illustrated as storing 64 bits at each storage location, in other embodiments the test image may have a different width, e.g. 8, 16 or 32 bits wide. In such cases the test controller 220 may read multiple words from the memory 205 to obtain the data equivalent to a single 64-bit word. Those skilled in the art will appreciate that the illustrated storage configuration is not exclusive of other possible configurations that mat yield similar benefit.

A test data start address field 305 holds a beginning location within the memory 205 of a test data block 310, e.g. the test stimuli used to populate the scan chains within the DUT 215. Between the test data start address field 305 and the test data block 310 are test control parameters 315. The test control parameters 315 include a scan chain length field 320. The scan chain length field 320 describes the length of the scan chains in the DUT 215. Each test data block 310 is associated with one of the test modules 245 in FIG. 2. For a particular test data block 310 some information specific to the associated test module 245 is typically stored in a domain configuration block 330. As an example, the illustrated embodiment includes (i) three TAP instructions 335a, 335b and 335c to reset and lock a phase-locked loop (PLL) associated with that particular test module 245; (ii) a number of individual tests for that particular module 245 in a pattern count field 340; (iii) a Golden Signature 345 expected to be output by the MISR 225 if the modules 245 operate properly; and (iv) additional test configuration information associated with the test configuration for the module 245. In general the test data blocks 310 associated with different ones of the test modules 245 will differ from each other.

The structure of the domain configuration block 330 may be repeated for each clock domain within the DUT 215. Illustratively, a domain configuration block 350 is shown for a second domain, e.g. CLK_DOMAIN 1, and a domain configuration block 355 for an $M^{th}$ domain, CLK_DOMAIN m.

The structure of the test control configuration block 325 may be repeated for as many test configurations as desired. Illustratively a last test control configuration block 360 (the $n^{th}$ configuration block) is shown. The test control configuration blocks need not configure every available clock domain within the DUT 215 for a particular test.

Figure 4:
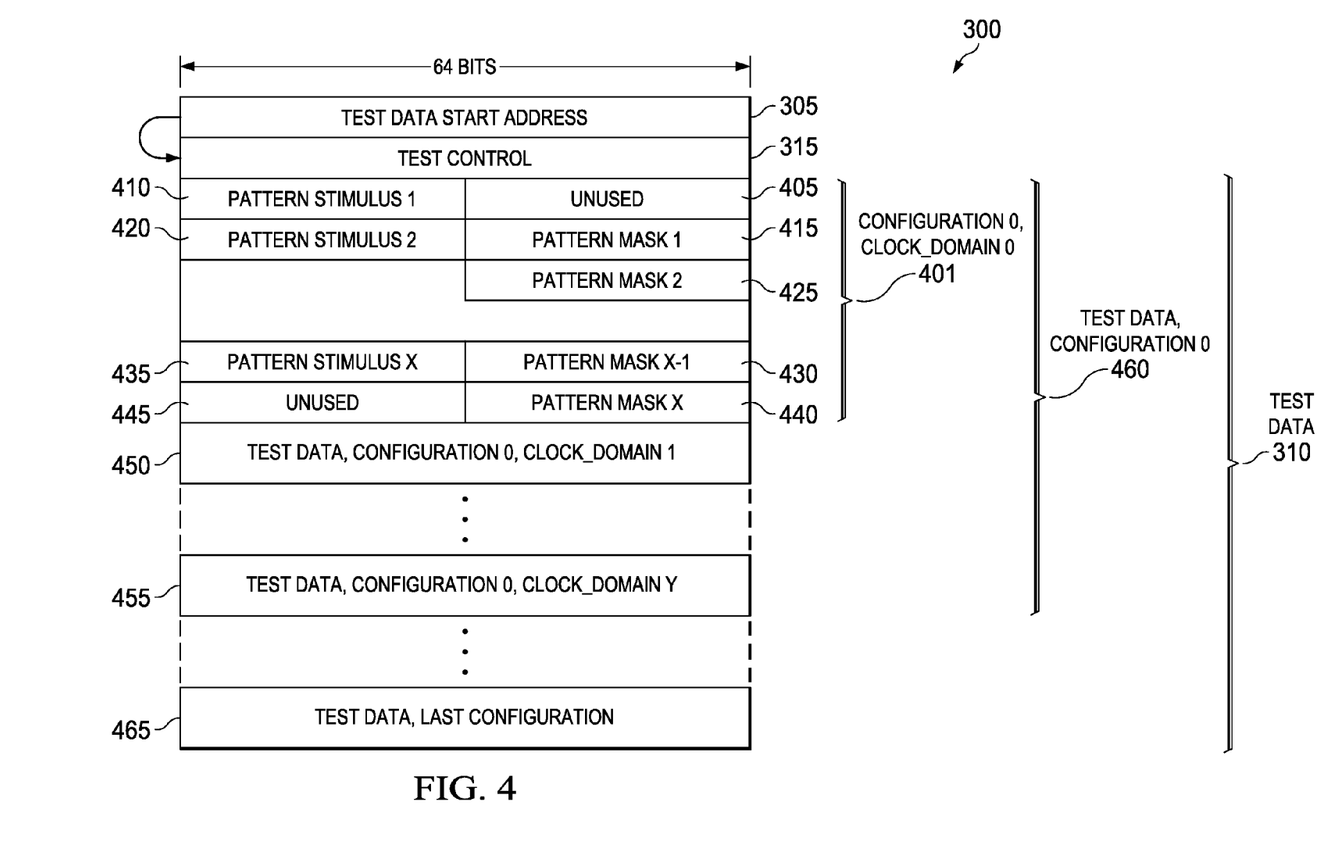

FIG. 4 illustrates the test data block 310 in greater detail. As described previously, the test data start address field 305 contains a pointer to the first location of the test data block 310. The illustrated arrangement of data fields within the test data block 310 is presented without limitation. Those skilled in the pertinent art will appreciate that many other arrangements of data are within the scope of the disclosure.

A first domain test configuration 401 includes test pattern data for a first test configuration CONFIG 0 and the first clock domain CLOCK_DOMAIN 0. Herein test pattern data may refer to pattern stimuli, pattern masks corresponding to the pattern stimuli, or both. A data field 405 and a data field 410 are located at a first memory address of the test data block 310. The data field 405 occupies the most significant 32 bits of the address location, while the data field 410 occupies the least significant bits of that location. In the illustrated embodiment the data field 405 is unused, and the data field 410 contains a first pattern stimulus.

A data field 415 and a data field 420 are located at a second memory address of the test data block 310. The data field 415 occupies the most significant 32 bits of the address location, while the data field 420 occupies the least significant bits of that location. The data field 415 contains a first pattern mask corresponding to the first pattern stimulus in the data field 410. The data field 420 contains a second pattern stimulus. A data field 425 at the next sequential address contains a second pattern mask corresponding to the second pattern stimulus.

The placement of subsequent pattern stimuli and pattern masks follows the pattern exemplified by the first pattern stimulus and the first pattern mask, with each pattern stimulus being located in the 32 most significant bits of a particular address of the memory 205, and the corresponding pattern mask being located in the least significant bits of the subsequent address. A data field 430 contains the pattern mask corresponding to the penultimate pattern stimulus of the first domain test configuration 401. A data field 435 contains the final pattern stimulus, while a data field 440 contains the corresponding final pattern mask. A data field 445 is unused.

A second domain test configuration 450 follows the first domain test configuration 401 and includes pattern stimulus and pattern mask data for the CLK_DOMAIN 2. As many subsequent domain test configurations follow as needed, ending with a final domain test configuration 455. The domain test configurations 401, 450 and 455, and any domain test configurations between the domain test configurations 450, 455 form a first test configuration block 460. Any number of additional test configuration blocks may follow the first test configuration block 460, ending with a final domain test configuration block 465. Each additional test configuration block may be formatted as illustrated by the first test configuration block 465.

Figure 5:
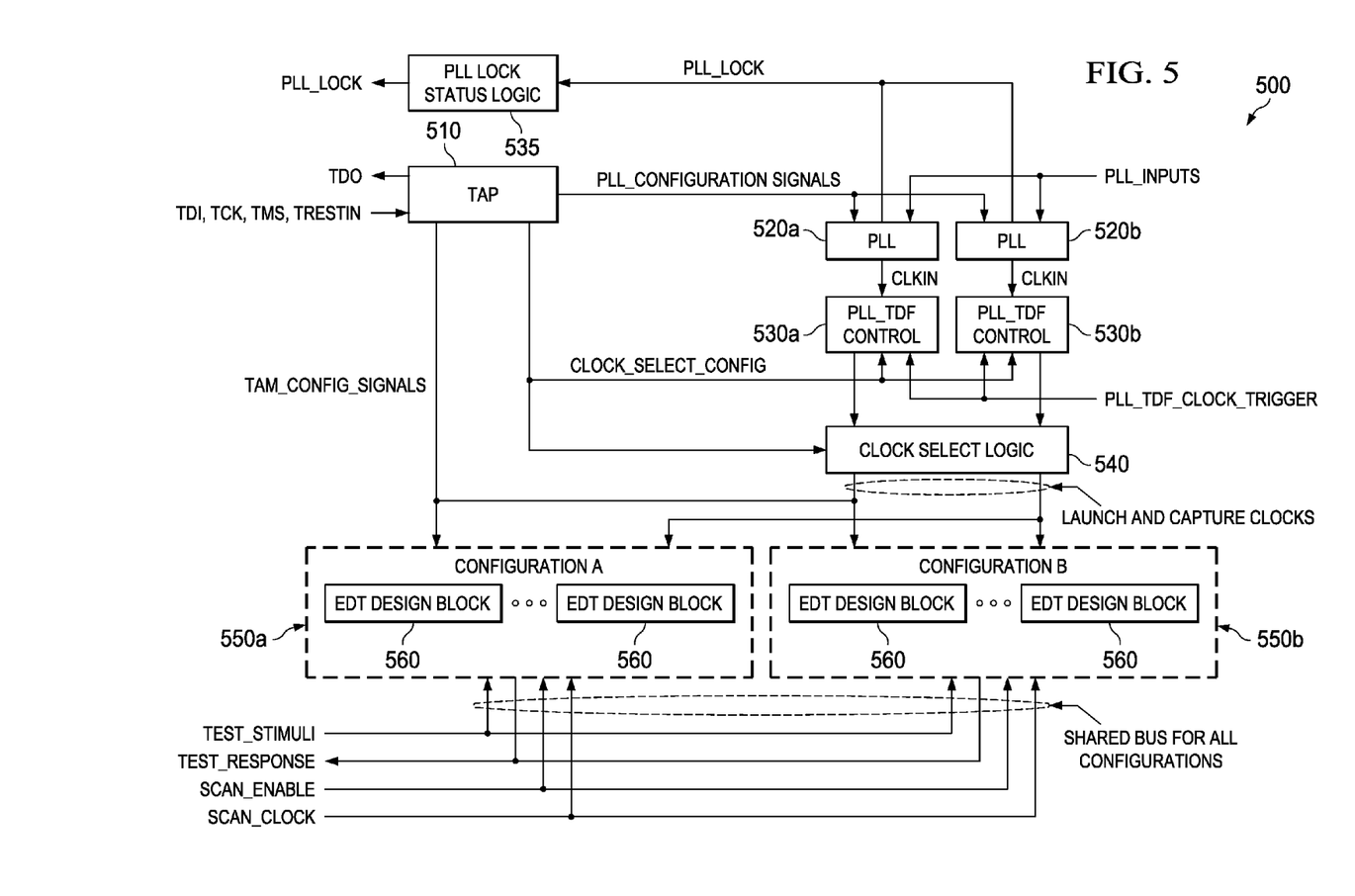
FIG. 5 shows an illustrative subsystem for controlling scan chains, such as those of FIG. 1, with a test access port (TAP)

FIG. 5 illustrates one suitable embodiment of a scan DFT system 500 that may be used with the DUT 215 of FIG. 2. The scan DFT system 500 is presented without limitation to any particular scan DFT system design to illustrate communication between various components of the DUT 215. Those skilled in the pertinent art will appreciate that the principles described herein may be adapted to other scan DFT systems. A TAP 510 receives scan control signals, e.g. from the test controller 220. Control signals may include TDI (test data in), TCK (test clock), TMS (test mode select) and TRESTIN (TAP reset). The TAP 510 provides a TDO (test data out) signal to the test controller 220. PLLs 520a, 520b receive configuration signals PLL CONFIG from the TAP 510 and provide respective clock outputs to PLL transition delay fault (PLL_TDF) controls 530a, 530b. The PLLs 520a, 520b also provide a status signal to PLL lock status logic 535 which provides a PLL lock signal PLL_LOCK, discussed further below. The PLL_TDF controls 530a, 530b receive clock select/configuration signals from the TAP 510, and a trigger signal PLL_TDF_CLOCK_TRIGGER from the test controller 220 during system test mode. The PLL_TDF controls 530a, 530b each provide a CLKOUT signal to clock select logic 540.

Figure 6A:
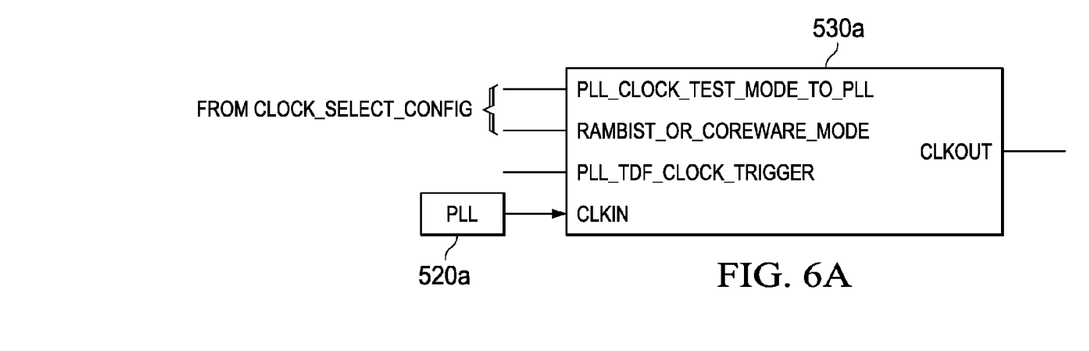
FIGS. 6A and 6B present illustrative control and timing related to generating a test launch/capture clock in a system such as that of FIG. 2.

FIG. 6A illustrates the operation of the PLL_TDF controls 530a, 530b in greater detail, with the PLL_TDF control 530a being representative. In this embodiment the PLL_TDF control 530a receives the PLL_TDF_CLOCK_TRIGGER and two additional control inputs, PLL_CLOCK_TEST_MODE_TO_PLL and RAMBIST_OR_COREWARE_MODE. As described previously, the PLL 520*a* provides a CLKIN signal. The PLL_TDF control 530*a* provides a single CLKOUT signal. The CLKOUT signal may be enabled, e.g. when either PLL_CLOCK_TEST_MODE_TO_PLL or RAMBIST_OR_COREWARE_MODE is asserted.

Figure 6B:
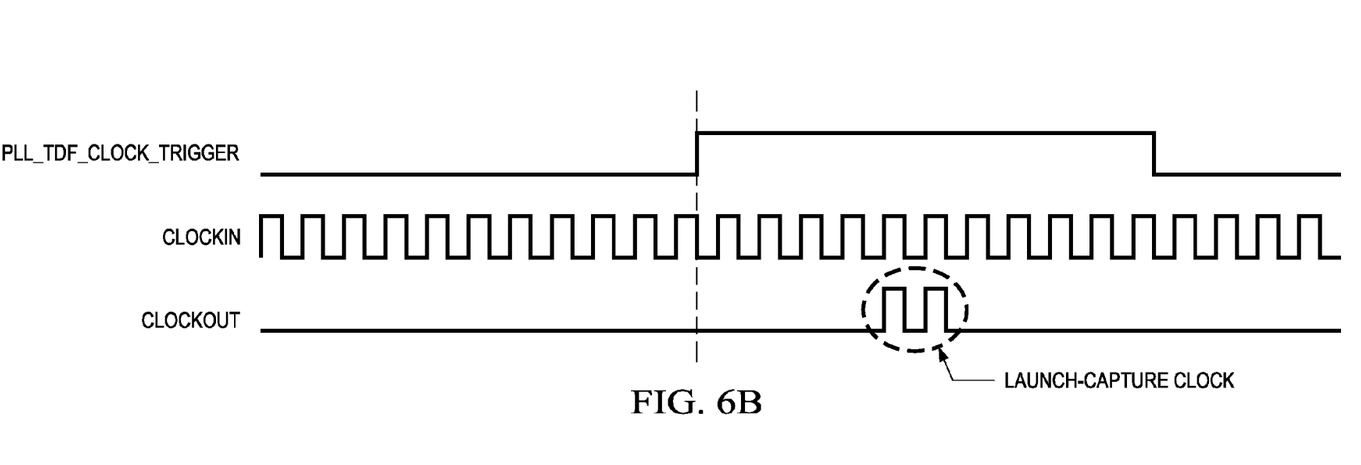

FIG. 6B presents illustrative timing relationships between some of the signals related to the PLL_TDF control 530*a*. The illustrated timing is provided for illustration of one example embodiment without limitation to any particular implementation. The CLKIN signal is represented as a square wave with 50% duty cycle. The PLL_TDF_CLOCK_TRIGGER is shown being asserted on a falling edge of the CLKIN, for example. A short period thereafter, e.g. a few clock cycles to switch from scan_shift to scan_apply and capture, the PLL_TDF control 530*a* produces two pulses corresponding to adjacent periods of CLKIN. These two high-speed clock pulses are referred to as a launch-capture clock. The interval between assertion of PLL_TDF_CLOCK_TRIGGER and the launch-capture clock may be configured as necessary to provide adequate setup time within the DUT 215, e.g. to load a test stimulus into the scan chain. The interval between the second pulse of the launch-capture clock and the de-assertion of the PLL_TDF_CLOCK_TRIGGER may be configured as necessary to provide adequate time within the DUT 215, e.g. for the test controller 220 to receive the test response into the MISR 225.

Returning to FIG. 5, the clock select logic 540, under control by the TAP 510, selects between the launch-capture clocks output by the PLL_TDF controls 530*a*, 530*b* for output to one of two test configurations CONFIG A 550*a* and CONFIG B 550*b*. The test configurations 550*a*, 550*b* also each receive test access mechanism (TAM) configuration signals from the TAP 510. Each test configuration 550*a*, 550*b* includes a number of EDT design blocks 560 that include scan chains. The EDT design blocks need not be identical. Each test configuration 550*a*, 550*b* further receives TEST_STIMULI, a SCAN_ENABLE signal and a SCAN_CLOCK under control by the test controller 220. Upon completion of a test scan, the test configuration 550*a*, 550*b* under test provides TEST_RESPONSE to the test controller 220.

Those skilled in the pertinent art will appreciate that scan DFT system 500, including the two PLLs 520*a*, 520*b* and the two test configurations 550*a*, 550*b* are illustrative and do not limit embodiments of the disclosure. Systems of the disclosure, e.g. the system 200, may include any number of PLLs and configurations, including appropriate control signals and timing relationships, as appropriate to the particular design implementation.

Figure 7:
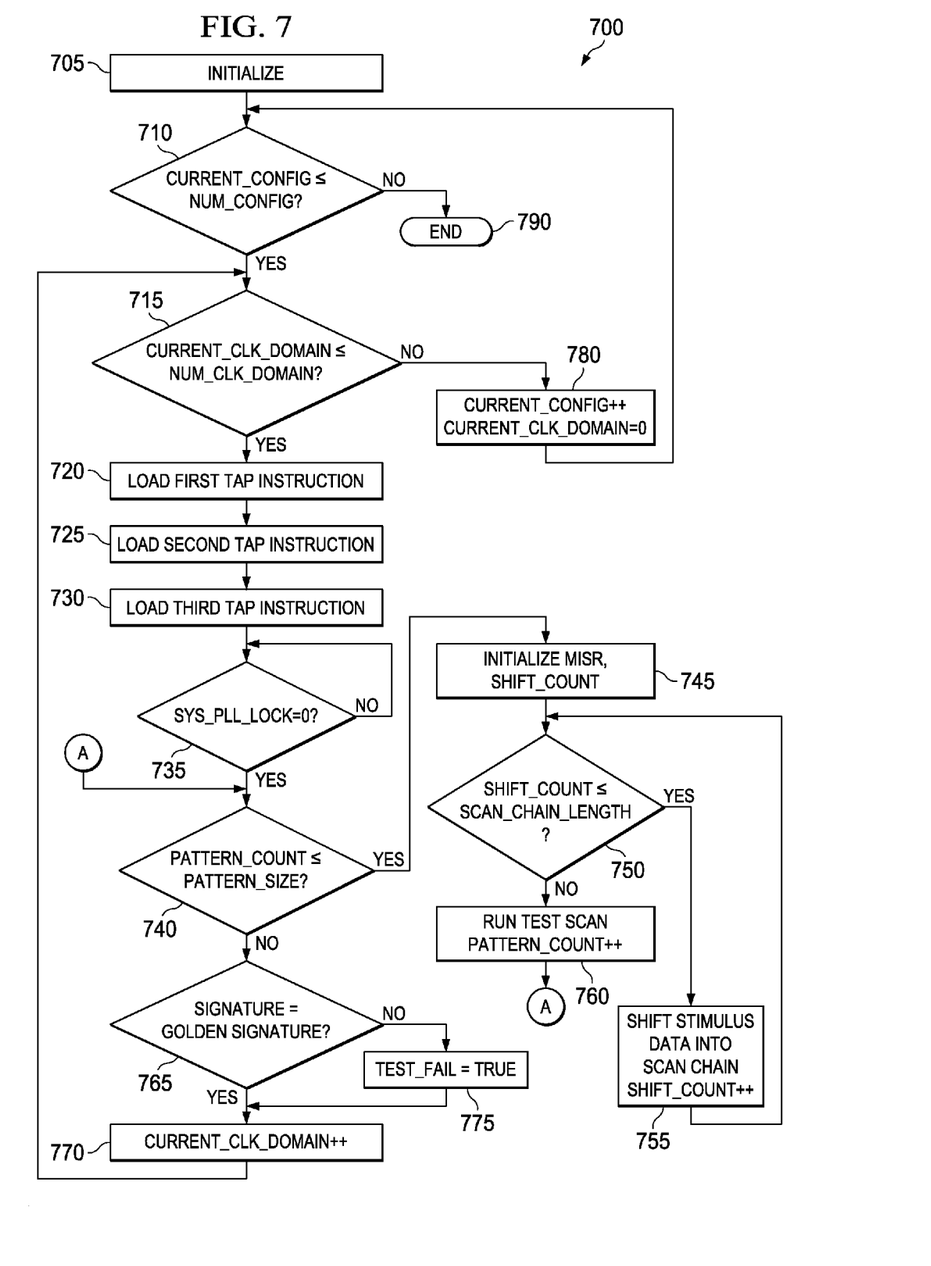
FIG. 7 illustrates an example of a method of operating a SP-LBIST system such as the system 200 of FIG. 2.

FIG. 7 illustrates an example method 700 of operating an SP-LBIST system, e.g. the system 200. FIG. 7 is described with reference to FIG. 3 and FIG. 8, which illustrates timing of various signals related to operation of the system 200 and the PLL lock status logic 535. The method 700 may be executed by the FSM 221.

In a step 705, the FSM 221 initializes various parameters of the system, including parameters NUM_CONFIG and NUM_CLK_DOMAIN, and loop counters CURRENT_CONFIG and CURRENT_CLK_DOMAIN. NUM_CONFIG and NUM_CLK_DOMAIN may respectively represent the number of test configurations and the number of clock domains the system 200 is configured to support. CURRENT_CONFIG and CURRENT_CLK_DOMAIN may be set to an initial value of zero. In a decisional step 710, the FSM 221 tests the value of CURRENT_CONFIG. If CURRENT_CONFIG is not greater than NUM_CONFIG, the method 700 advances to a decisional step 715. In the step 715, the FSM 221 tests the value of CURRENT_DOMAIN. If CURRENT_DOMAIN is not greater than NUM_DOMAIN, then the method 700 advances to a step 720.

Figure 8:
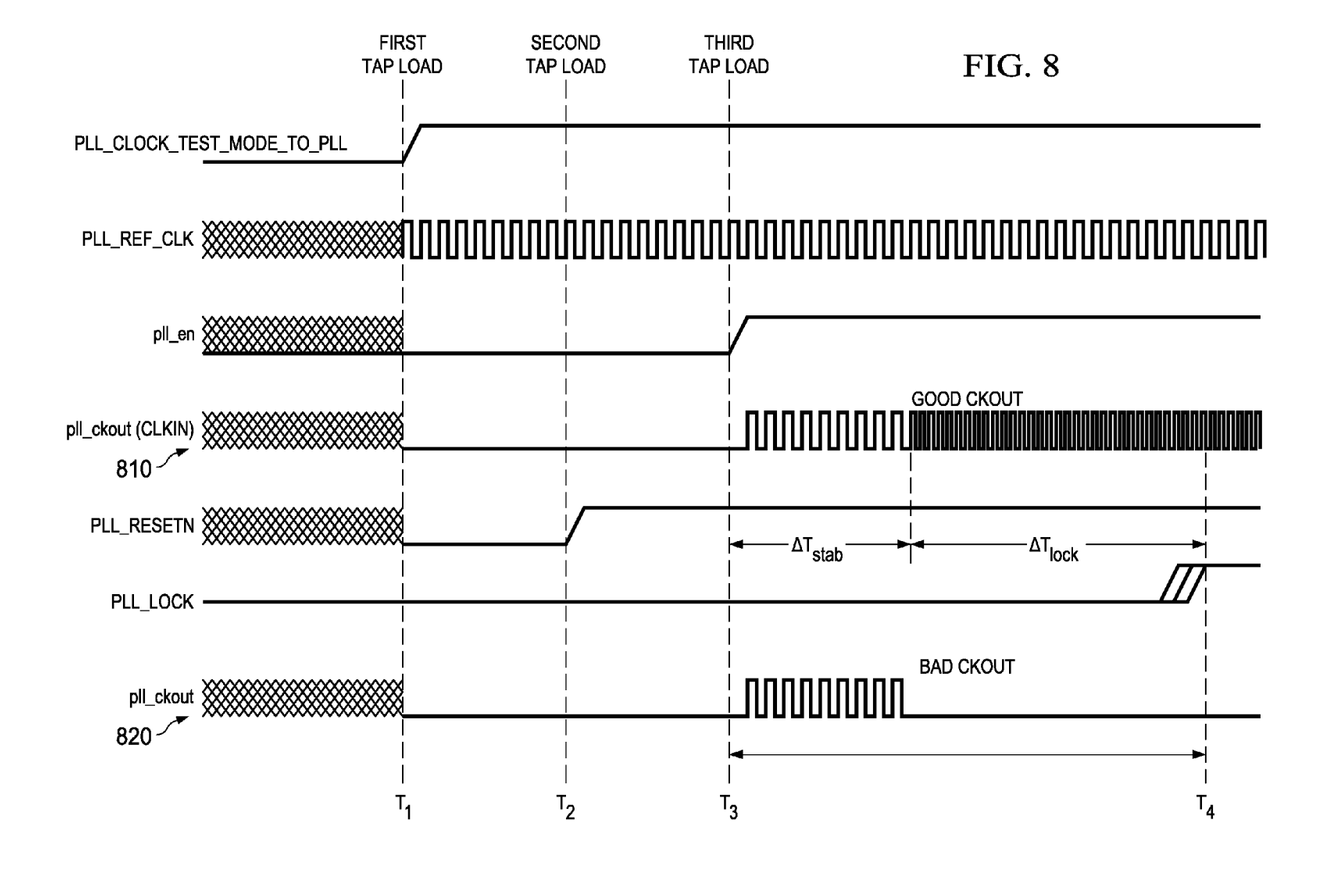
FIG. 8 illustrates phase-lock loop operation in the system of FIG. 2 in one example embodiment.

In the step 720 the first TAP instruction 335*a* is read from the memory 205 and copied to the TAP 255. A PLL reset signal, PLL_RESETN, is reset. Referring to FIG. 8, the step 720 corresponds about to a time $T_1$. Shortly thereafter, the reference clock outputs of the PLLs 520*a*, 520*b* stabilize.

In a step 725 the second TAP instruction 335*b* is read from the memory 205 and copied to the TAP 255. The PLL_RESETN signal is then set. Referring to FIG. 8, the step 725 corresponds about to a time $T_2$.

In a step 730 the third TAP instruction 335*c* is read from the memory 205 and copied to the TAP 255. The PLL_RESETN signal is maintained in a set state. Referring to FIG. 8, the step 730 corresponds about to a time $T_3$.

In a decisional step 735, the FSM 221 tests the SYS_PLL_LOCK signal. If SYS_PLL_LOCK indicates one or more of the PLLs 520*a*, 520*b* has failed to lock, then the method 700 branches to the step 735 and tests SYS_PLL_LOCK again. The step 735 may repeat until SYS_PLL_LOCK indicates the PLLs 520*a*, 520*b* are both locked, or until a timeout directs the method 700 to an error handling step (not shown).

FIG. 8 illustrates examples of operational timing of the PLL lock status logic 535. The examples are illustrative, and do not limit the disclosure to any particular implementation of operational timing. In an example 810, after an enable signal PLL_EN from the TAP 510 is asserted, the PLL outputs (CLKIN) initially outputs a clock signal at the same frequency as a PLL_REF_CLK. After a stabilization period $\Delta T_{Stab}$, the PLL output stabilizes at a lock frequency. After a detection period $\Delta T_{Lock}$, the PLL lock status logic 535 determines the PLL output is locked and asserts the PLL_LOCK signal at a time $T_4$. In a counterexample 820, the PLL fails to lock after $\Delta T_{stab}$. After $\Delta T_{Lock}$, the PLL lock status logic 535 determines the PLL output is not locked the PLL_LOCK signal is not asserted. The test controller 220 may take appropriate action in this event, such as reporting a test hardware failure and halting the test.

Returning to FIG. 7, the method 700 next advances to a decisional step 740. In the step 740, a PATTERN_COUNT is compared to a PATTERN_SIZE. PATTERN_SIZE refers to the value stored by the pattern count field 340 (FIG. 3), e.g. the size of the test pattern used for the clock domain under test. PATTERN_SIZE may be initially set to zero during the step 705.

If PATTERN_COUNT is not greater than the PATTERN_SIZE, the method 700 advances to a step 745. In the step 745, the MISR 225 is initialized, and a variable SHIFT_COUNT is reset to zero.

In a decisional step 750, SHIFT_COUNT is compared to a test parameter SCAN_CHAIN_LENGTH. SCAN_CHAIN_LENGTH is a length of the scan chain, and therefore also the number of test stimuli to be read from the memory 205 for the present test. The SCAN_CHAIN_LENGTH may be stored in the memory 205, e.g. in the scan chain length field 320 (FIG. 3).

In a step 755, a test stimulus read from the memory 205 is shifted into the scan chain. SHIFT_COUNT is then incremented. The method 700 loops between the steps 750, 755 until SHIFT_COUNT exceeds SCAN_CHAIN_LENGTH, at which time the method branches to a step 760.

In the step 760, the test controller 220 initiates the test using the stimuli previously loaded into the scan chain, such as by asserting PLL_TDF_CLOCK_TRIGGER (FIG. 6B). As described previously, the test stimuli are applied to the tested logic within the DUT 215, and test results are obtained. Test results are shifted out of the scan chain and into the MISR 225. PATTERN_COUNT is incremented, and control returns to the step 740.

PATTERN_COUNT exceeds PATTERN_SIZE when the test pattern has been completely read out to the DUT 215. At this time, the method 740 branches to a decisional step 765. At this step the MISR 225 may evaluate the test signature by determining if the test signature is equal to the Golden Signature 345 (FIG. 3). If the test signature is equal to the Golden Signature 345, the method 700 advances directly to a step 770, increments CURRENT_CLK_DOMAIN and returns control to the step 715. On the other hand, if the test signature does not equal the Golden Signature, the method branches to a step 775 in which TEST_FAIL is set, indicating a test failure. In the illustrated embodiment, the method advances from the step 775 to the step 770. In other embodiments, the method 700 may instead advance to an error handling routine, which may perform any appropriate action, such as storing information regarding the failing test pattern and/or stopping the test.

The method 700 repeats the loop 715-770 until CURRENT_CLK_DOMAIN exceeds NUM_CLK_DOMAIN. When this occurs, the method 700 branches to a step 780 in which CURRENT_CONFIG is incremented and CURRENT_CLK_DOMAIN is reset. Control then returns to the step 710. The method 700 repeats the loop 710-770 until CURRENT_CONFIG exceeds NUM_CONFIG. When this occurs, the method concludes with a terminating step 790.

Figure 9:
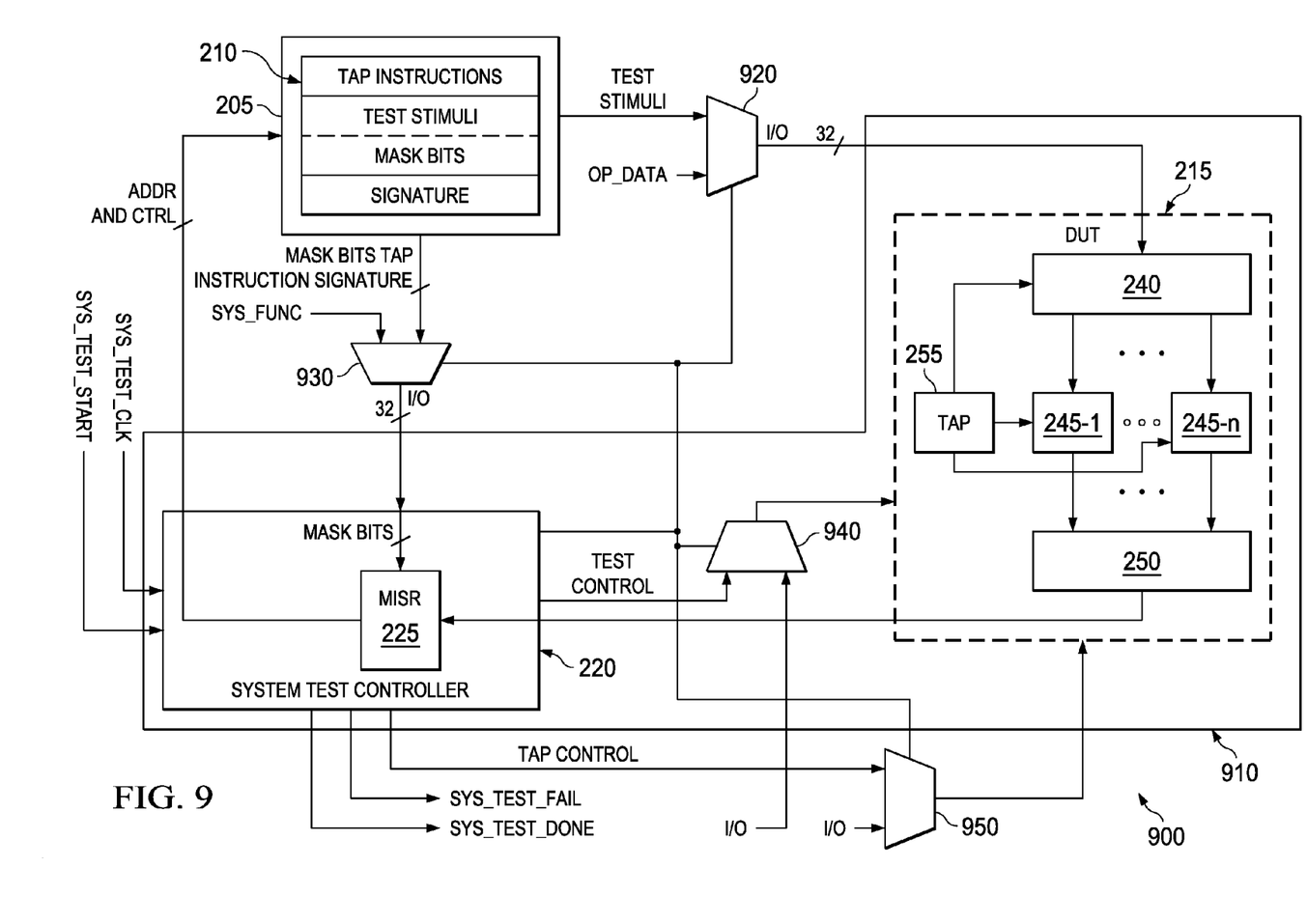
FIG. 9 illustrates an embodiment of an SP-LBIST system in which the test controller and DUT share a common substrate.

Turning to FIG. 9, illustrated is an embodiment of a system 900 modified for the case that the test controller 220 and the DUT 215 are located on a same semiconductor substrate 910, e.g. integrated circuit (IC) 910. In this embodiment, multiplexers 920, 930, 940, 950 under control by the test controller 220 alternatively provide operational data or test data to I/O pins of the IC 910. For example, a multiplexer 920 provides a path for test stimuli from the memory 205 or operational data to the DUT 215. A multiplexer 930 provides a path for test mask bits from the memory 205 or system data to the test controller 220. Similarly a multiplexer 940 provides a path for test control data or external data to the DUT 215, and a multiplexer 950 provides a path for TAP control data or external data to the DUT 215.

Figure 10:
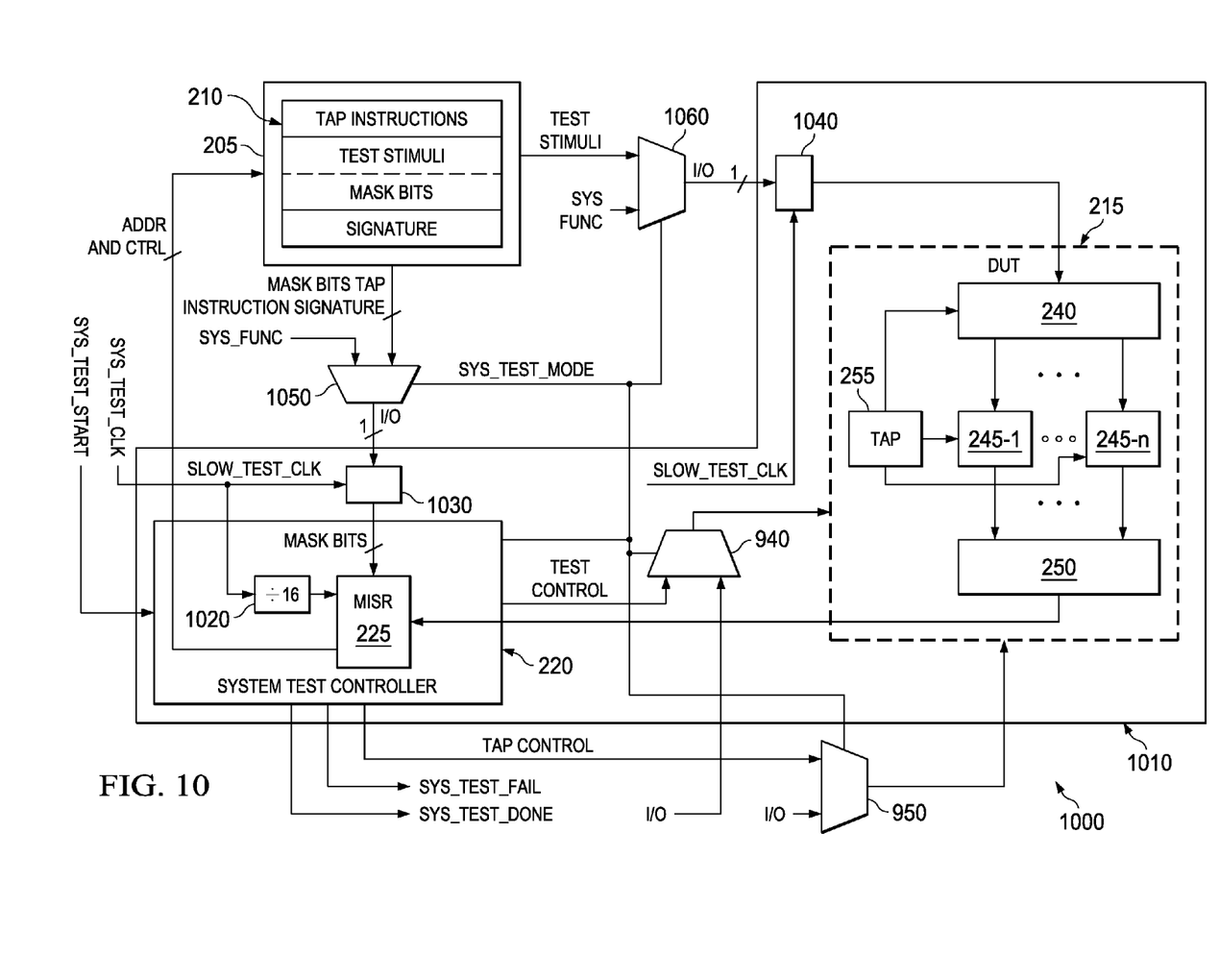
FIG. 10 illustrates an embodiment of an SP-LBIST system in which the memory provides test data to the DUT via a serial data path.

FIG. 10 illustrates an embodiment of a system 1000 in which the pin count of an IC 1010 is reduced relative to the IC 910. The SYS_TEST_CLK, referred to synonymously in the present embodiment as a SLOW_TEST_CLK, runs at a frequency greater than that of the systems 200, 900 by a factor of, e.g. 16. The test controller 220 includes a ÷16 divider 1020 that reduces the SLOW_TEST_CLK to a reduced-frequency clock. The reduced-frequency clock clocks the MISR 225 and other components of the test controller 220. The SLOW_TEST_CLK clocks two shift registers 1030, 1040, e.g. 16 bit shifters. The shift registers 1030, 1040 receive serial data at their respective inputs and output parallel data bits corresponding to the received serial data at their respective outputs. The memory 205 provides data to multiplexers 1050, 1060 via serial data paths that connect to the IC 1010 via two respective I/O pins. Providing the data in serial fashion may include converting data stored in parallel fashion within the memory 205 to a serial bit stream output by a single output port. The number of I/O pins required to receive the mask bits and test stimuli are reduced from, e.g. 64 to two. If desired the pin count of the IC 1010 may be further reduced by employing a similar strategy with respect to data received by the multiplexers 940, 950.

The I/O pin reduction exemplified by the system 1000 is particularly advantageous in large-scale integrated devices for which pin count may be large. In the illustrated embodiment, only four additional I/O pins are needed to implement the SP-LBIST scheme. Moreover, by providing serial data input to the DUT 215, the impact of the SP-LBIST scheme on the design of the DUT 215 is minimized.

Figure 11:
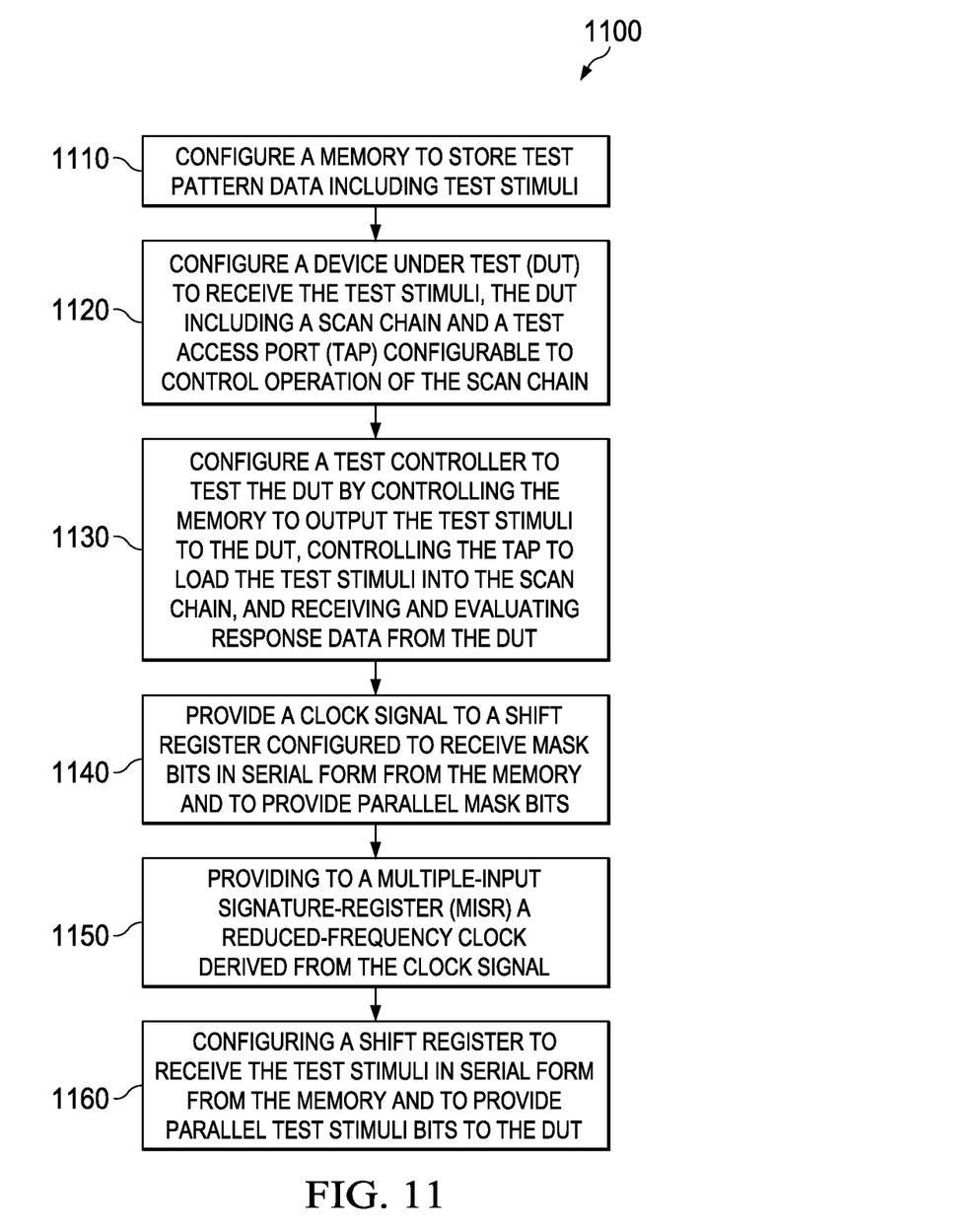
FIG. 11 is a method of manufacturing an SP-LBIST system such as the systems of FIGS. 2, 9 and 10.

FIG. 11 presents a method 1100 of manufacturing a system such as the systems 200, 900, 1000. The method 1100 is described without limitation in terms of the various embodiments described here, such as FIGS. 2, 5, 8, 9 and 10. The steps of the method 1100 may be performed in an order other than that illustrated.

In a step 1110, the memory 205 is configured to store test pattern data, e.g. test stimuli and pattern masks. The test pattern data may be stored in a manner such as that described by FIGS. 3 and 4. In a step 1120, a device under test such as the DUT 215 is configured to receive the test stimuli. The device under test includes a scan chain and a test access port, e.g. the TAP 255, that is configurable to control operation of the scan chain.

In a step 1130, a test controller, e.g. the test controller 220, is configured to test the DUT by controlling the memory to output the test stimuli to the DUT. The test controller is further configured to control the TAP to load the test stimuli into the scan chain, and to receive and evaluate response data from the DUT. In various embodiments the test controller is capable of performing the test upon receiving only two external input signals and providing test results with only two external output signals.

In an optional step 1140, a clock signal is provided to a shift register, such as the shift register 1030. The shift register is configured to receive mask bits in serial form from the memory and to output parallel mask bits. In another optional step 1150, a reduced-frequency clock derived from the clock signal is provided to a multiple-input signature-register such as the MISR 225. The multiple-input signature-register may be configured to receive the response data from the DUT, and to receive the parallel mask bits. In another optional step 1160 a shift register such as the shift register 1040 is configured to receive the test stimuli in serial form from the memory, and to provide parallel test stimuli bits to the DUT.

Those skilled in the art to which this application relates will appreciate that other and further additions, deletions, substitutions and modifications may be made to the described embodiments.

What is claimed is:

1. A stored-pattern logic built-in self-test system, comprising:
   a memory for storing test pattern data including test stimuli;
   a device under test that includes a scan chain and a test access port configurable to control operation of said scan chain;
   a test controller configured to test said device under test by controlling said memory to output said test stimuli to said device under test, controlling said test access port to load said test stimuli into said scan chain, and receiving and evaluating response data from said device under test;
   a shift register configured to be clocked by a clock signal, to receive mask bits in serial form from said memory, and to output parallel mask bits; and a multiple-input signature-register configured to receive a reduced-frequency clock derived from said clock signal, said multiple-input signature-register being further configured to evaluate said response data using said mask bits.

2. The system of claim 1, wherein said test controller is further configured to test said device under test upon receiving only two external input signals consisting of a test start signal and a clock signal.

3. The system of claim 1, wherein said test controller is configured to report a result of said test by providing only two external output signals consisting of a test completion signal and a test result signal.

4. The system of claim 1, wherein said test controller and said device under test are located on a common substrate.

5. The system of claim 1, further comprising a shift register configured to receive said test stimuli in serial form from said memory and to provide parallel test stimuli bits to said device under test.

6. The system of claim 1, wherein said device under test is configured to produce a launch-capture clock based on a phase-locked loop, and said test controller is configured to halt said test in the event that said phase-locked loop fails to lock.

7. A method of manufacturing a stored-logic built-in self-test system, comprising:
configuring a memory to store test pattern data including test stimuli;
configuring a device under test to receive said test stimuli, said device under test including a scan chain and a test access port configurable to control operation of said scan chain;
configuring a test controller to test said device under test by controlling said memory to output said test stimuli to said device under test, controlling said test access port to load said test stimuli into said scan chain, and receiving and evaluating response data from said device under test;
providing a clock signal to a shift register configured to receive mask bits in serial form from said memory and to output parallel mask bits; and
providing to a multiple-input signature-register a reduced-frequency clock derived from said clock signal, said multiple-input signature-register being further configured to evaluate said response data using said mask bits.

8. The method of claim 7, wherein said test controller is capable of performing said test upon receiving only two external input signals consisting of a test start signal and a clock signal.

9. The method of claim 7, wherein said test controller is capable of reporting a result of said test by providing only two external output signals consisting of a test completion signal and a test result signal.

10. The method of claim 7, wherein said controller and said device under test are located on a common substrate.

11. The method of claim 7, further comprising configuring a shift register to receive said test stimuli in serial form from said memory and to provide parallel test stimuli bits to said device under test.

12. The method of claim 7, wherein said device under test is configured to produce a launch-capture clock based on a phase-locked loop, and said test controller is configured to halt said test in the event that said phase-locked loop fails to lock.

13. An integrated circuit, comprising:
scan chains configured to receive test stimuli and to apply said test stimuli to combinatorial logic;
a test access port configured to control operation of said scan chains;
a test controller configured to test said combinatorial logic by receiving test access port instructions from a memory, controlling operation of said test access port in accordance with said test access port instructions, and receiving and evaluating response data from said scan chains;
a shift register configured to be clocked by a clock signal and to receive mask bits in serial form from said memory and to output parallel mask bits; and
a multiple-input signature-register configured to receive a reduced-frequency clock derived from said clock signal, said multiple-input signature-register being further configured to evaluate said response data using said mask bits.

14. The integrated circuit of claim 13, wherein said test controller is capable of performing said test upon receiving only two external input signals consisting of a test start signal and a clock signal.

15. The integrated circuit of claim 13, wherein said test controller is capable of reporting a result of said test by providing only two external output signals consisting of a test completion signal and a test result signal.

16. The integrated circuit of claim 13, further comprising a shift register configured to receive said test stimuli via a single input-output port in serial fashion.

17. The integrated circuit of claim 13, wherein said device under test is configured to produce a launch-capture clock based on a phase-locked loop, and said test controller is configured to halt said test in the event that said phase-locked loop fails to lock.

18. A stored-pattern logic built-in self-test system for testing a device under test that includes a scan chain and a test access port configurable to control operation of said scan chain, the built-in self-test system comprising:
a memory for storing test pattern data that include test stimuli; and
a test controller configured to test said device under test by:
controlling said memory to output said test stimuli to said device under test;
controlling said test access port to load said test stimuli into said scan chain; and
receiving and evaluating response data from said device under test;
a shift register, clocked by a clock signal, for:
receiving mask bits in serial form from said memory; and
outputting parallel mask bits; and
a multiple-input signature-register for:
receiving a reduced-frequency clock derived from said clock signal; and
evaluating said response data using said mask bits.

19. The system as recited in claim 18, further comprising a device under test, said device under test being configured to receive said test stimuli and to provide said response data to said test controller.

* * * * *